United States Patent [19]

Yorifuji et al.

[11] 4,434,363
[45] Feb. 28, 1984

[54] PHOTOELECTRIC SWITCHING APPARATUS

[75] Inventors: Yuki Yorifuji, Hirakata; Seiichi Uyama, Katano; Katsuhiko Fukutake, Matsuzaka; Masaharu Miyazaki, Mie, all of Japan

[73] Assignee: Matsushita Electric Works, Ltd., Kadoma, Japan

[21] Appl. No.: 262,772

[22] Filed: May 11, 1981

[51] Int. Cl.³ .............................................. H01J 40/14
[52] U.S. Cl. ................................ 250/214 B; 250/221; 340/556
[58] Field of Search ............... 250/206, 208, 209, 221, 250/222, 214 B; 340/555, 556, 557

[56] References Cited

U.S. PATENT DOCUMENTS

| | | | |
|---|---|---|---|
| 3,704,461 | 11/1972 | Rose et al. | 340/556 |
| 3,924,253 | 12/1975 | Marino | 340/556 |
| 4,068,222 | 1/1978 | Treviranus | 250/221 |
| 4,266,124 | 5/1981 | Weber et al. | 340/556 |
| 4,272,762 | 6/1981 | Geller et al. | 250/221 |

*Primary Examiner*—David C. Nelms
*Attorney, Agent, or Firm*—Cushman, Darby & Cushman

[57] ABSTRACT

A photoelectric switching apparatus includes a light transmitter part having a first built in oscillator and a detachable light transmitter circuit driven by the first oscillator. A detachable light emitter is provided for emitting light in response to a signal from the light transmitter circuit. A light receiver part includes a photoelectric transducer for converting a light signal incident thereon to a converted electric signal and a second oscillator which is separate from the light transmitter part and can be connected to the light transmitter circuit when the light transmitter circuit and the light emitter together are detached from the first oscillator. The light receiver part has a D-flip-flop which reads input data based on the converted electric signal by utilizing an output signal of the first oscillator as its clock pulse. The first oscillator issues an output signal which is substantially synchronous with the converted electric signal to the D-flip-flop by utilizing a signal based on the converted electric signal when the light transmitter circuit and the light emitter are detached from the first oscillator. The first oscillator issues an output signal which drives the light transmitter circuit, to the D-flip-flop when the light transmitter is connected to the first oscillator.

6 Claims, 10 Drawing Figures separate-disposition
type combined-disposition
light-interception
type combined-disposition
light-reflection
type

PHOTOELECTRIC SWITCHING APPARATUS

BACKGROUND OF THE INVENTION

1. Field of the Invention

The present invention relates to an improvement in a photoelectric switching apparatus.

The present invention particularly concerns a photoelectric switching apparatus usable in various kind of usages.

2. Prior Arts

Photoelectric switching apparatuses have been recently widely used for operation of an automatic door or the like system. In such conventional photoelectric switching apparatuses, modulated lights are used in order to avoid maloperation due to light noise. And in a receiver part of the apparatus the modulated light is detected by utilizing a synchronizing signal obtained from the light transmitter of the system. By use of such synchronized detection, the true signal to be detected is selectively taken out by removing the noises therefrom. In such system, in case the light transmitter part and the light receiver part are disposed considerably apart and both units are operated by different power lines, it is difficult to convey the synchronizing signal from the light transmitter part to the light receiver part. In such apartly disposed system, in place of using such synchronizing signal, such systems have been constituted that the pulse signals obtained by detection of the received light is integrated for a predetermined time period and an output signal is issued when the integrated signal reaches a predetermined level. However, such system has shortcomings that its response is relatively slow due to the use of the integration circuit, and that the integration circuit can not dicriminate the genuine signal when a number of the noise pulses are input sequentially.

An improvement for overcoming the shortcomings of the conventional system has been proposed as shown in FIG. 1, wherein a light transmitter part A comprises an oscillator 8, a light transmitter circuit 1 and a light transmitting transducer 101, and a light receiver part B comprises a light receiving transducer 201, a light receiver circuit 2, an amplifier 9, a waveform shaper 10, a square wave generator 3 an integration circuit 4 and comparator 11, and the output of the waveform shaping circuit 11 is given to an output circuit 5. The provision of the square wave generator 3 serves to produce a square wave with a considerable pulse width at each triggering by an input pulse signal of narrow pulse width, thereby enabling shortening the time period required for the integration circuit to produce its output by integrating the input pulse signal thereto. However, such conventional systems still have the drawback that input of the sequential noises are likely to cause maloperation of the circuit. Therefore, it is still required to operate the receiving part by utilizing a synchronizing signal.

Furthermore, hitherto there are three different types of such photoelectric switches. The first kind is one where, as shown in FIG. 2(a), the light transmitter part A and the light receiver part B are separately disposed opposing each other with a path of detecting object M inbetween. In this case, the light is intercepted by the detecting object M. This type is hereinafter called a "separate-disposition type." The second way is one where, as shown in FIG. 2(b), the light transmitter part A and the light receiver part B are disposed in a close position and a light reflecting means D is disposed opposing to both parts with the path of detecting object M or M' inbetween so as to reflect the light to the light receiving part B. In this case too, the light is intercepted by the detecting object M. This case is hereinafter called a "combined-disposition light interception type." The third way is one where, as shown in FIG. 2(c), the light transmitter part A and the light receiver part B are disposed in a close position, both facing the path of the detection object M. In this case the light is reflected by the detecting object M. This case is hereinafter called a "combined-disposition light reflection type."

As is obvious from the comparison of the type of FIG. 2(a) and the types of FIG. 2(b) and FIG. 2(c), the former type has the light transmitter part A in a separate case from the receiver part B, and hence detection of the received signal is made in a non-synchronized way, while the latter two types have the light transmitter part A in the same case with the receiver part B, and hence the detection is made in a synchronized way.

Furthermore, in the types of FIG. 2(a) and FIG. 2(b), the light interception is detected to produce an output signal. In these types, in order to remove erroneous detection output at the initial transient time immediately after a switching on of the apparatus, the integration circuit 4 must be specially operated, for instance that, a special circuitry is formed for quick charging of a timer capacitor in the integration circuit 4 during this initial transient stage. On the contrary, in the type of FIG. 2(c), the light reflection is detected to produce an output signal. In this type, in order to remove erroneous detection output at the initial transient time immediately after a switching on of the apparatus, the integration circuit 4 must be oppositely operated to the above case, that is, a special circuitry is formed for quick discharging of a timer capacitor in the integration circuit 4 during this initial transient stage. Therefore, hitherto, though having almost the same circuit configurations as each other, the apparatuses of the types of FIG. 2(a), FIG. 2(b) and FIG. 2(c) have been separately manufactured with respect to the abovementioned different special circuitries in the integration circuit 4, as well as, the above-mentioned inclusion of the transmitter part and the synchronized detection.

SUMMARY OF THE INVENTION

The present invention is intended to provide an improved photoelectric switching apparatus capable of stable and reliable switching operations for any way of usings of the "separate-disposition type," "combined-disposition light interception type" and "combined-disposition light reflection type." And, the apparatus in accordance with the present invention is capable of reliable switching even when used in the way of "separate-disposition type" where no synchronizing signal is received by the light receiving part B from the light transmitter part A during the light interception by the detection object M. Therefore, the apparatus in accordance with the present invention is capable of great compatibility for the various kinds of way of using, and is very useful.

DETAILED DESCRIPTION OF THE PREFERRED EMBODIMENTS

Figure 3:
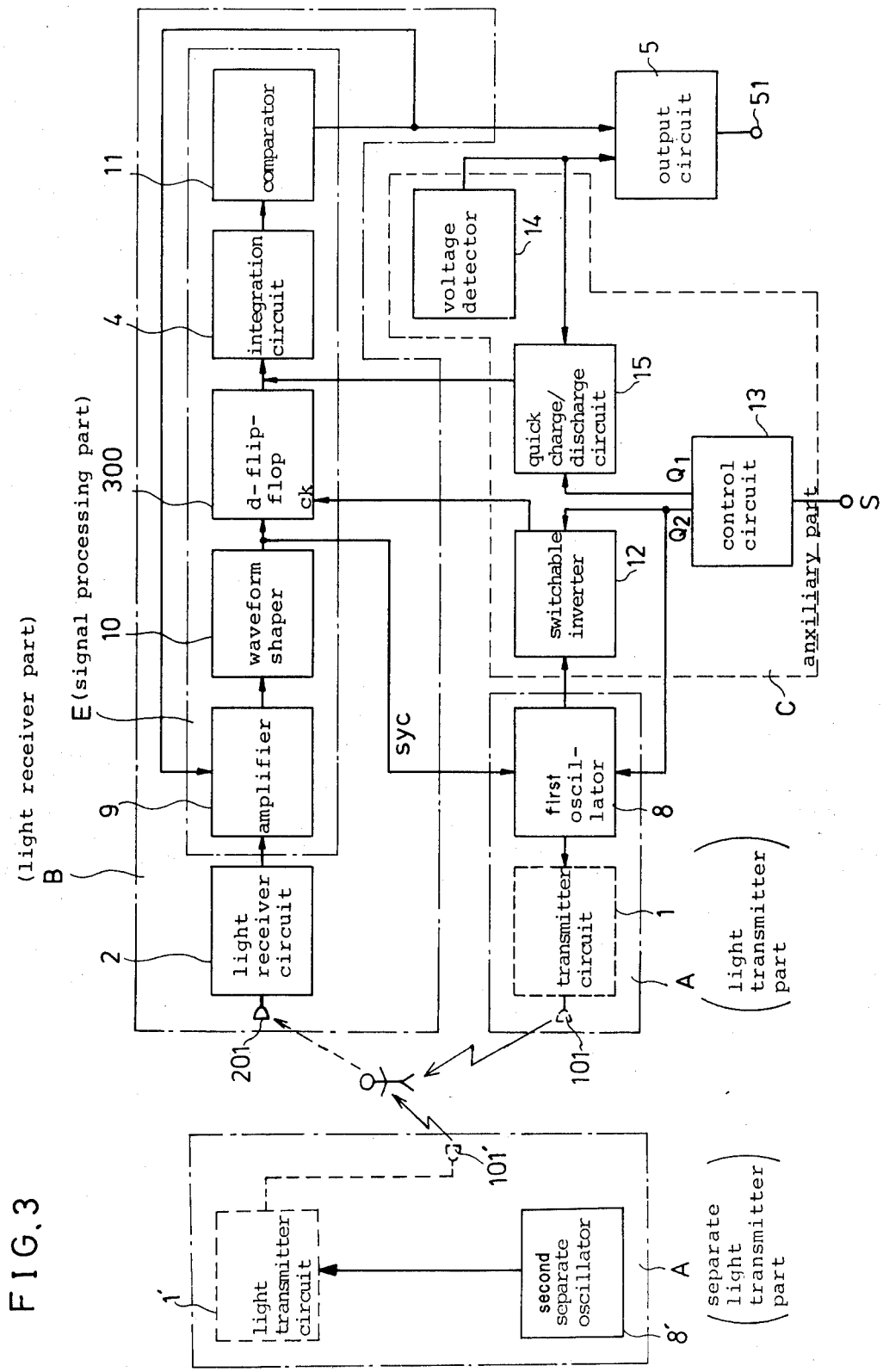
FIG. 3 is a block diagram of a photoelectric switching apparatus embodying the present invention.

A photoelectric switching apparatus in accordance with the present invention comprises a light receiver part (B) and a built-in light transmitter part (A), an auxiliary part (C) and optionally a separate light transmitter part (A'), as shown by FIG. 3.

The light receiver part (B) comprises a light receiver circuit 2 which takes out the A.C. component of an electric signal converted from the light signal incident on a light receiving transducer 201, and a signal processing part (E) for processing the output signal of the light receiver circuit 2. The signal processing part E comprises an amplifier 9, a waveform shaper 10, a d-flip-flop 300, an integration circuit 4, and a comparator 11 connected in sequence. The comparator 11 sends its output to the output circuit 5. The separate light transmitter part A' comprises separate or a second oscillator 8' and a second light transitter circuit 1' which gives its output to the light transmitting transducer 101'. The built-in light transmitter part (A) comprises a built-in or first oscillator 8 and a first light transmitter circuit 1. The auxiliary part (C) comprises a control circuit 13, a voltage detector 14, a quick charge/discharge circuit 15 and a switchable inverter 12. The output of the comparator 11 is given to the output terminal through an output circuit 5.

Details of the embodiment is now elucidated referring to FIG. 3 and thereafter.

Figure 1:
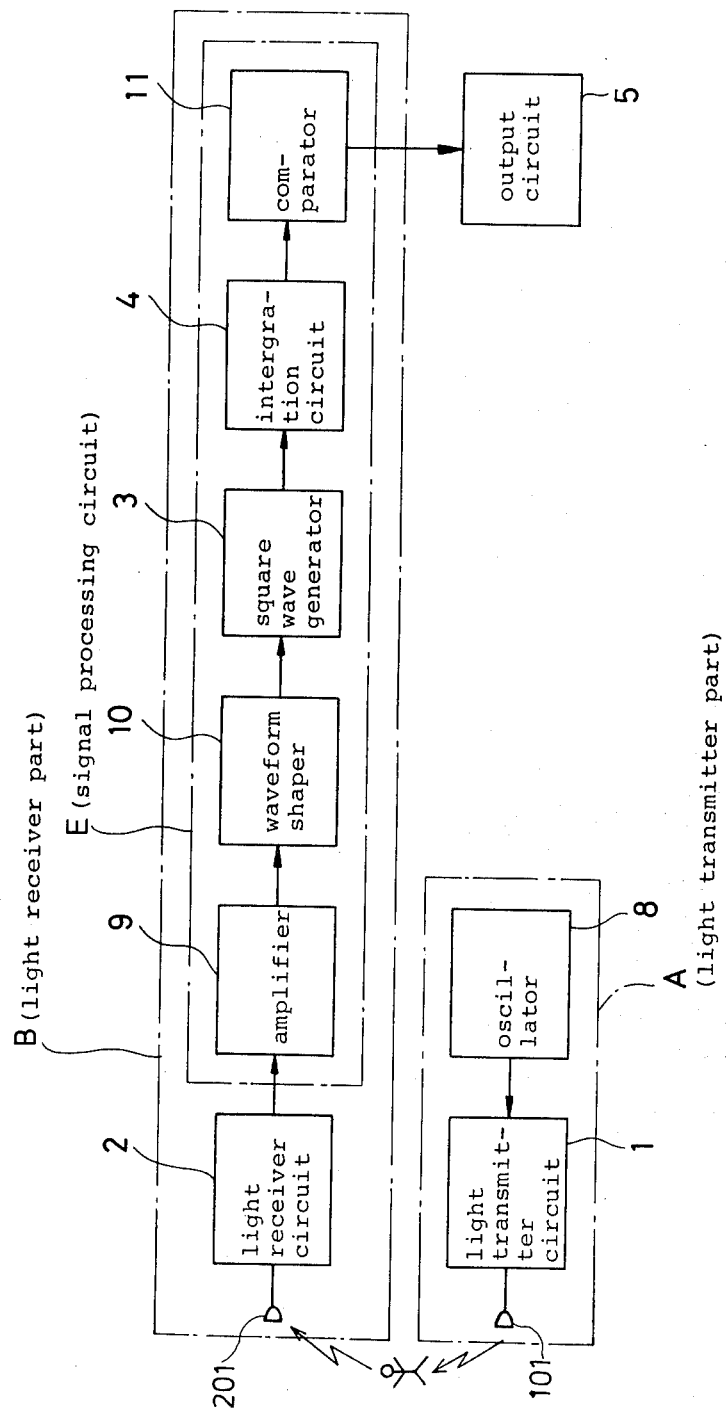
FIG. 1 is a block diagram of a conventional photoelectric switching apparatus.
Figure 2A:
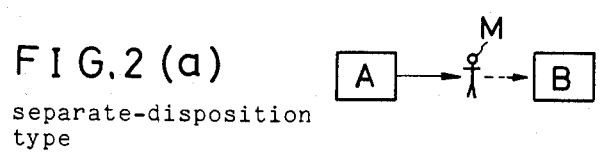
FIG. 2(a) is a schematic view of showing the use of the photoelectric switching apparatus of the separate-disposition type.
Figure 2B:
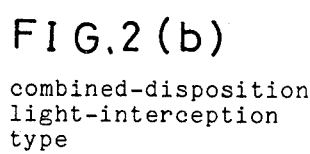
FIG. 2(b) is a schematic view of showing the use of the photoelectric switching apparatus of the combined-disposition light interception type.
Figure 2C:
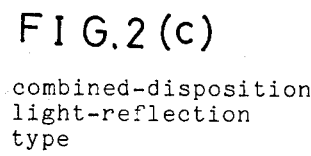
FIG. 2(c) is a schematic view of showing the use of the photoelectric switching apparatus of the combined-disposition light reflection type.

The apparatus of FIG. 3 can be used three ways shown by FIG. 2(a), FIG. 2(b) and FIG. 2(c). For the first way of FIG. 2(a), the first light transmitter circuit 1 and the first light transmitting transducer 101 are removed from the built-in light transmitter part A to the separate light transmitter part A'. For the second way of FIG. 2(b) and the third way of FIG. 2(c), the first light transmitter 1 and the first light transmitting transducer 101 are used in the built-in light transmitter part A, and the different operations of the circuit are selected by kinds of input signals applied to the control circuit 13.

In the light receiver part B, the light receiver circuit 2 is an AC amplifier which selectively sends the AC component of the signal from the photoelectric transducer 201 to the amplifier 9. The waveform shaper receives the output of the amplifier and produces a square wave 10 and give it to the d-flip-flop 300. The d-flip-flop also receives a triggering signal from the built-in oscillator 8 at its clock input terminal ck through the switchable inverter 12, which switches selectively to pass the oscillator output as it is or as inverted corresponding to the input control signal from the control circuit 13. The d-flip-flop 300 is of the edge trigger type and sends an output pulse which reads in, i.e., rises up or falls down (i) at the timing of each fall down of the clock pulse when the light transducer receives light from the built-in light transmitter part A, or (ii) at the timing of each rise up of the clock pulse when the light transducer receives light from said separate light transmitter part A'. The integration circuit 4 is a low pass filter of a very long time constant and substantially integrates the signal from the d-flip-flop 300 and sends an output to the comparator 11.

The comparator 11 outputs a signal when integrated output voltage 4 reaches a predetermined level.

In the built-in light transmitter part A, the built-in oscillator 8 sends an output to the first light transmitter circuit 1, on top of the clock input terminal ck of the d-flip-flop 300, so that the light transmitted from the transducer 101 is modulated by the frequency of the oscillation signal of the built-in the transducer 101 and the first light transmitting circuit 1 is detachably disposed, and for the use of the apparatus in the first way shown by FIG. 2(b) removed into the separate light transmitter part A' for use as the transducer 101' and the circuit 1' therein.

In the separate light transmitter part A', the separate oscillator 8' is designed to have its oscillation frequency slightly (for instance 3 to 20%) higher than that of said built-in oscillator 8. By such selection of the relation between the oscillation frequency, when the separate oscillator 8' is used, by the synchronization loop syc from the waveform shaper 10 to the built-in oscillator 8, the frequency is synchronized to that of the separate oscillator 8', thereby eliminating undesirable disturbance by noise-light.

Figure 4:
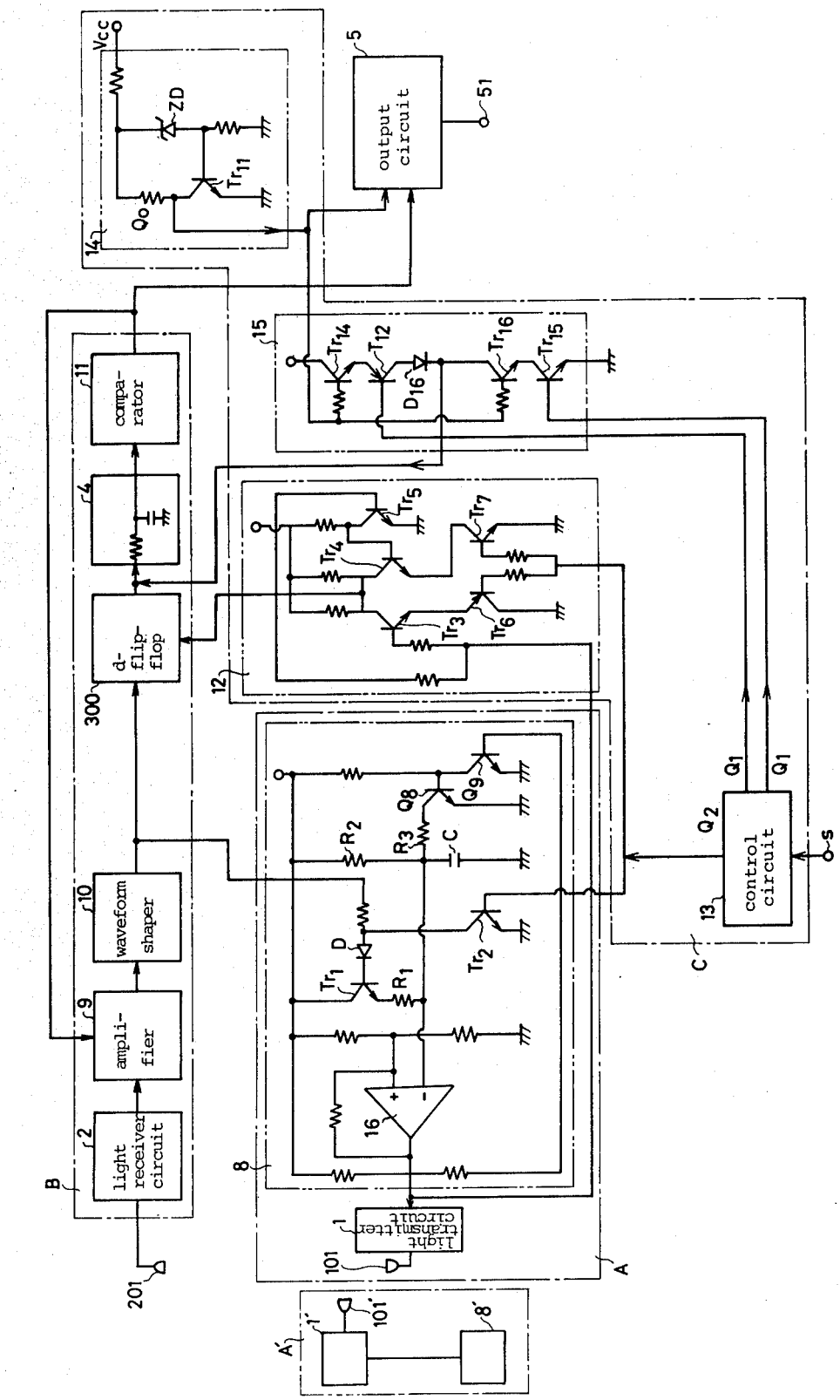
FIG. 4 is a detailed circuit diagram of the apparatus of FIG. 3.
Figure 5:
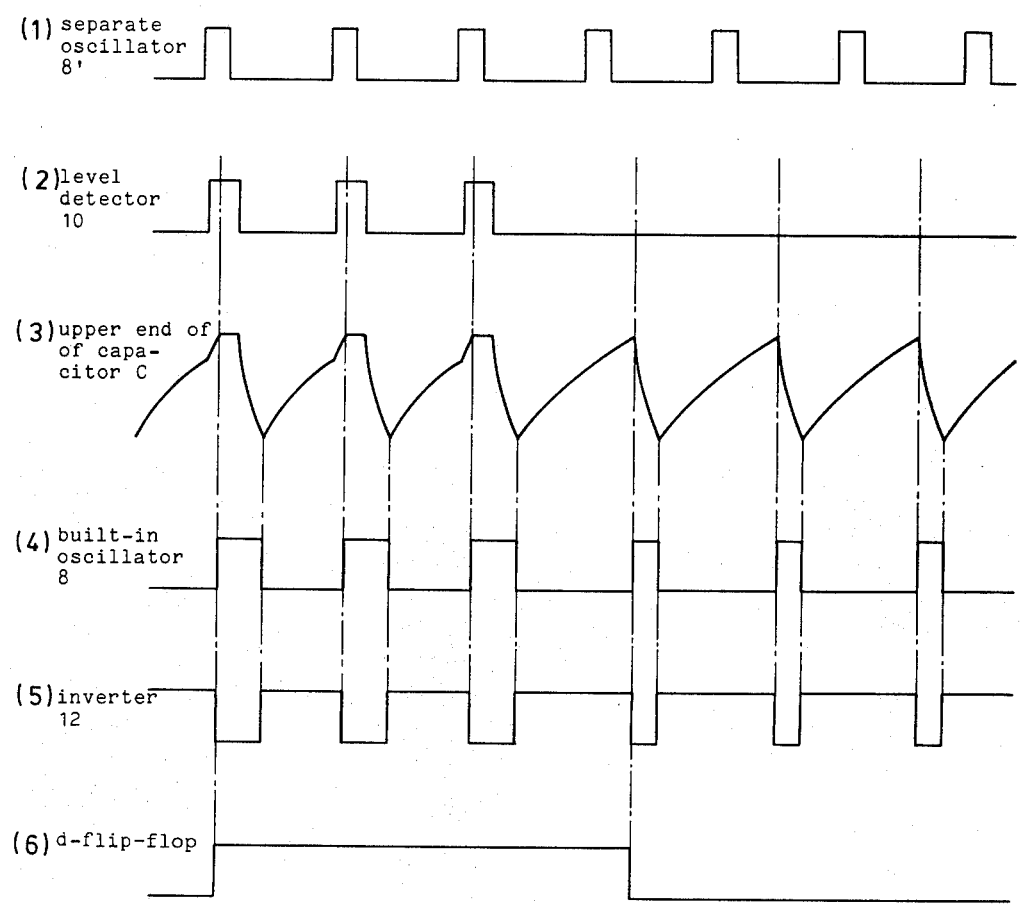
FIG. 5 is a time chart showing waveforms of various parts of the circuit of FIGS. 3 and 5.

FIG. 4 shows detailed structure of the apparatus, especially of, built-in oscillator 8, the switchable inverter 12, quick charge/discharge circuit 15 and voltage detector 14. FIG. 5 is a time chart showing waveforms of various parts of the circuits of FIG. 3 and FIG. 4.

The built-in oscillator 8 comprises an operation amplifier 16 and oscillation transistors $Q_8$ and $Q_9$ as oscillation elements, a switching transistor $Tr_1$ for changing a time constant of the built-in oscillator 8, a switching transistor $Tr_2$ for inactivating the transistor $Tr_1$ (to fix in off state) by the signal from the control circuit 13. The switchable inverter 12 comprises transistors $Tr_3$–$Tr_6$, $Tr_4$–$Tr_7$ and $Tr_5$, and the bases of the transistors $Tr_6$ and $Tr_7$ receive the control signal from the control circuit 13. The output of the switchable inverter circuit 12 is taken out from the collectors to the clock input terminal ck of the d-flip-flop.

When the photoelectric transducer 201 receives no light signal from the separate light transmitter part A', then the level detector 10 issues no output pulse as shown on the right half part of the waveform (2) of FIG. 5. In this case the upper end of the capacitor C in the built-in oscillator 8 is a simple charge-discharge curve shown by the right half part of the waveform (3), and the waveforms of the output pulse (4) of the built-in oscillator 8, the inverter 12 and d-flip-flop 300 are as shown on the right half parts of the waveforms (4), (5) and (6). in this case the oscillation frequency of the built-in oscillator 8 is not drawn into that of the separate oscillator 8' and oscillates at its own frequency of, for instance 2 KHz.

When the photoelectric transducer 201 receives a light signal from the separate light transmitting part A', then the level detector 10 issues output pulses having the frequency of the separate oscillator 8' of, for instance 2.8 KHz, as shown on the left half part of the waveform (2) of FIG. 5. In this case, the transistor $Tr_1$ is made on by the pulse signal from the level detector 10. And therefore, during this on period a series connection of internal resistance of the transistor $Tr_1$ and a resistor $R_1$ is connected in parallel to the charging resistor $R_2$, and hence the charging time constant is considerably reduced. Accordingly, the waveform of the voltage at the upper end of the capacitor C becomes as shown on the waveform (3) of left half part of FIG. 5. By this change of the waveform of the voltage across the capacitor C from the no-light signal state shown on the right half part of FIG. 5, the frequency of the oscillation of the built-in oscillator 8 becomes draw-into the oscillation frequency (for instance 2.8 KHz) of the separate oscillator 8', and also the front edge or rising up time of the output pulses of the built-in oscillator 8 make some advance of phase during the light signal reception time. As a result, the output signal of the d-flip-flop 300, which is then selected to work in the fall-down-edge trigger mode, issues an "H" output as shown by the waveform (b) of left part of FIG. 5. In order to attain the above-mentioned operations elucidated referring to FIG. 4, it is necessary that the oscillation frequency of the built-in oscillator 8 is slightly lower than that of the separate frequency 8', since the drawing-in of the oscillation frequency of the former (8) to that of the latter (8') necessitates the above-mentioned frequency relation that the oscillator to be drawn-in must have a slightly lower frequency. Experiments shows that the difference of the frequency is preferably 3 to 20%, and for under 3% the frequency relation may inverse due to change of working voltages or working temperatures between the two oscillators 8 and 8', and for over 20% it is difficult to attain stably draw-in.

The transistor $Tr_2$ is connected by its collector to and through a diode D to the base of the switching transistor $Tr_1$, and by its base to the control circuit 13.

When an "H" signal is input from the control circuit 13 to the base of the transistor $Tr_2$, the transistor $Tr_1$ is fixed off, and therefore draw-in operation by the output of the level detector is ceased. At the same time, by receiving the "H" output from the control circuit 13, the switchable inverter 12 is switched to non-inversion mode, and hence the output signal of the built-in oscillator 8 is passed to the clock input signal ck as it is.

The voltage detection circuit 14 as shown in FIG. 4 comprises a constant voltage diode (zener diode) ZD and a transistor $Tr_{11}$ and produces an output when the power source voltage $V_{cc}$ reaches a predetermined steady state voltage. The output of the constant voltage circuit 14 is given to the output circuit 5, which is a gating circuit, and prevents the output signal of the comparator 11 from being sent to the output terminal 51, thereby to eliminate maloperation at the initial stage of switching in of the apparatus.

The quick charge/discharge circuit 15 selectively works to quickly charge or discharge the charge of a capacitor in the integration circuit 4, and comprises transistors $Tr_{12}$, $Tr_{14}$, $Tr_{16}$ and $Tr_{15}$ and a diode $D_{16}$. This circuit receives control signals $Q_1,\overline{Q_1}$ from the control circuit 13. When the control signals $Q_1,\overline{Q_1}$ are "H", then the circuit 15 operates in quick charging; and when the control signals $Q_1,\overline{Q_1}$ are "L," then the circuit 15 operates in quick discharging. The former case is for the way of using of the separate-disposed type of FIG. 2(a) and the latter case is for the ways of usings of the combined-disposition types of FIG. 2(b) and FIG. 2(c).

Figure 6:
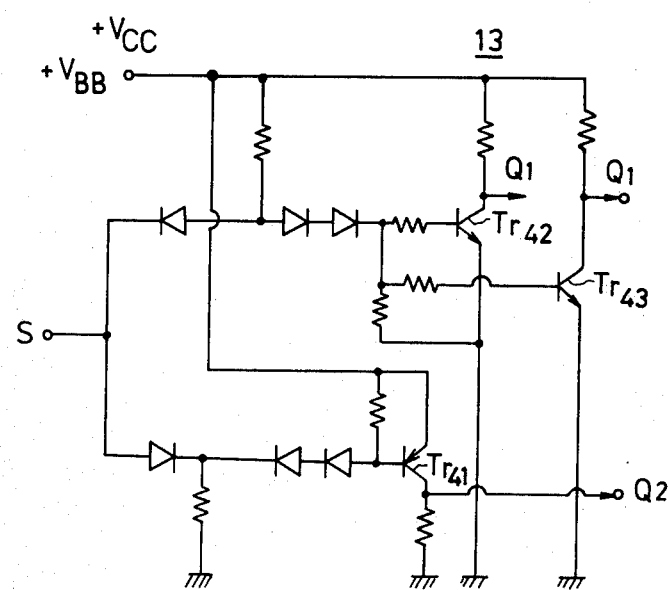
FIG. 6 is an example of the circuit diagram of the control circuit 13.

The control circuit 13 is for producing control signals to be given to the switchable inverter 12, built-in oscillator 8 and to the quick charge/discharge circuit 15. The control circuit 13 is constituted as shown by FIG. 6. The control circuit comprises three transistors $Tr_{41}$, $Tr_{42}$ and $Tr_{43}$ and several diodes and resistors. The collectors of the transistors $Tr_{42}$ and $Tr_{43}$ issues control signals $Q_1$ and $\overline{Q_1}$ to the quick charge/discharge circuit 15. The collector of the transistor $Tr_{41}$ issues the control signal $Q_2$ to the built-in oscillator 8 and the switchable inverter 12. This control circuit changes output signal corresponding to three kinds of states of its input terminal S. The operation of the circuit of FIG. 6 is elucidated. (i) When the input terminal S is set to "H" level, both transistors $Tr_{42}$ and $Tr_{43}$ become on and the transistor $Tr_{41}$ becomes off. Therefore, the outputs $Q_1,\overline{Q_1}$ becomes "L" and the $Q_2$ output also becomes "L." (ii) When the input terminal S is left open, both transistors $Tr_{42}$ and $Tr_{43}$ become on, and therefore the outputs $Q_1,\overline{Q_1}$ become "L" and the output $Q_2$ become "H." (iii) When the input terminal S is set to "L" level, both transistors $Tr_{42}$ and $Tr_{43}$ become off and makes the outputs $Q_1,\overline{Q_1}$ "H," and the transistor $Tr_{41}$ become on making the $Q_2$ output "H."

The total operations, with respect to the state of the input terminal S, of the relevant built-in oscillator 8, switchable inverter 12 and the quick charge/discharge circuit are as follows:

(i) When the input terminal S is set to "H" level:
   Both outputs $Q_1$ and $Q_2$ become "L." By means of the $Q_2$ outputs of "L," the built-in oscillator 8 is switched to the mode to draw-in the oscillation frequency of the separate oscillator 8' receiving the output of the waveform shaper 10, and the switchable inverter 12 inverts the output of the built-in oscillator 8 and sends it to the d-flip-flop 300 as the clock pulse thereto.

By means of the $Q_1$ output of "L," the quick charge/discharge circuit operates to quickly charge the capacitor of the integration circuit 4 at the initial stage of the switch on of the power source of the apparatus, so that the apparatus can work as the separate disposition type photoelectric switch.

(ii) When the input terminal S is in Open state:
   By the open state of the terminal S, the output $Q_1$ becomes "L" and the output $Q_2$ becomes "H." By the $Q_1$ of "L," the capacitor of the integration circuit 4 is made to be quickly charging at the initial stage of the switch on of the power source. By the $Q_2$ of "H," the built-in oscillator 8 is selected to the mode of non drawing-in to the oscillation frequency of the separate oscillator 8', and the apparatus operates to detect the the input modulated signal by the synchronized detection utilizing the frequency of the built-in oscillator 8. Also by the $Q_2$ of "H," the switchable inverter 12 ceases inverting operation and passes the oscillation signal of the built-in oscillator 8 as it is to the d-flip-flop 3.
   Accordingly, the apparatus operates in the type of combined-disposition light-interception type shown by FIG. 2(b).

(iii) When the input terminal S is set to "L" level:

Both outputs Q₁ and Q₂ become "H." By means of the Q₁ output of "H," the quick charge-discharge circuit 15 makes the capacitor of the integration circuit to quickly discharge at the initial stage of the power source switching on, thereby setting the apparatus to suit for the use of the light-reflection type of FIG. 2(c).

By the Q₂ output of "H," the built-in oscillator circuit 8 and the switchable inverter circuit 12 are set to operate the synchronized detection. therefore, the apparatus operates in the combined-disposition light-reflection type of FIG. 2(c).

In the quick charge/discharge circuit 15 (a) when the Q₁ signal is "L" and in case the constant voltage circuit 14 issues "H" signal, the H signal quickly charges the capacitor in the integration circuit through the transistors $Tr_{14}$ and $Tr_{12}$, since the transistor $Tr_{15}$ is off.

(b) When the Q₁ signal is H and in case the constant voltage circuit 14 issues "H" signal, the charges in the capacitor of the integration circuit is quickly discharged through the transistors $Tr_{16}$ and $Tr_{15}$, since the transistor $Tr_{12}$ is off. By the above-mentioned operations of the circuits 14, 15, 4 and 5, the output circuit suppresses undesirable outputting of erroneous signal until the voltage detected by the circuit 14 becomes steady state.

The principal parts of the abovementioned circuits are manufactured in an integrated circuit (IC), and the IC comprises the terminals for connection to the first light transmitter part 1, the light receiver circuit 2, output circuit 5, positive and negative power source terminals, control signal input terminal S and related components.

Figure 7:
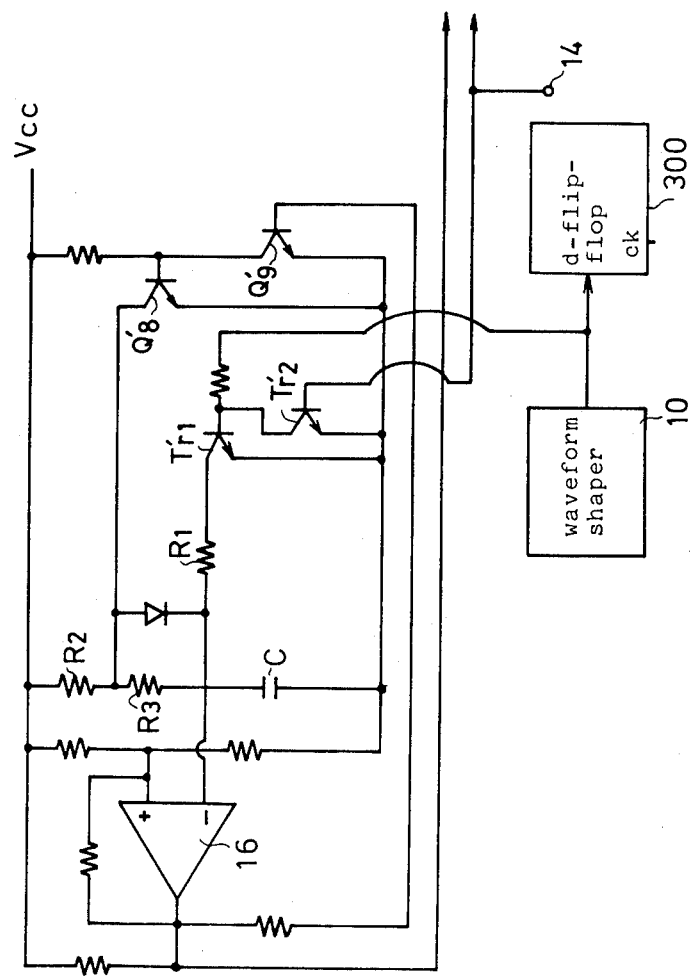
FIG. 7 is another example of the built-in oscillator 8.
Figure 8:
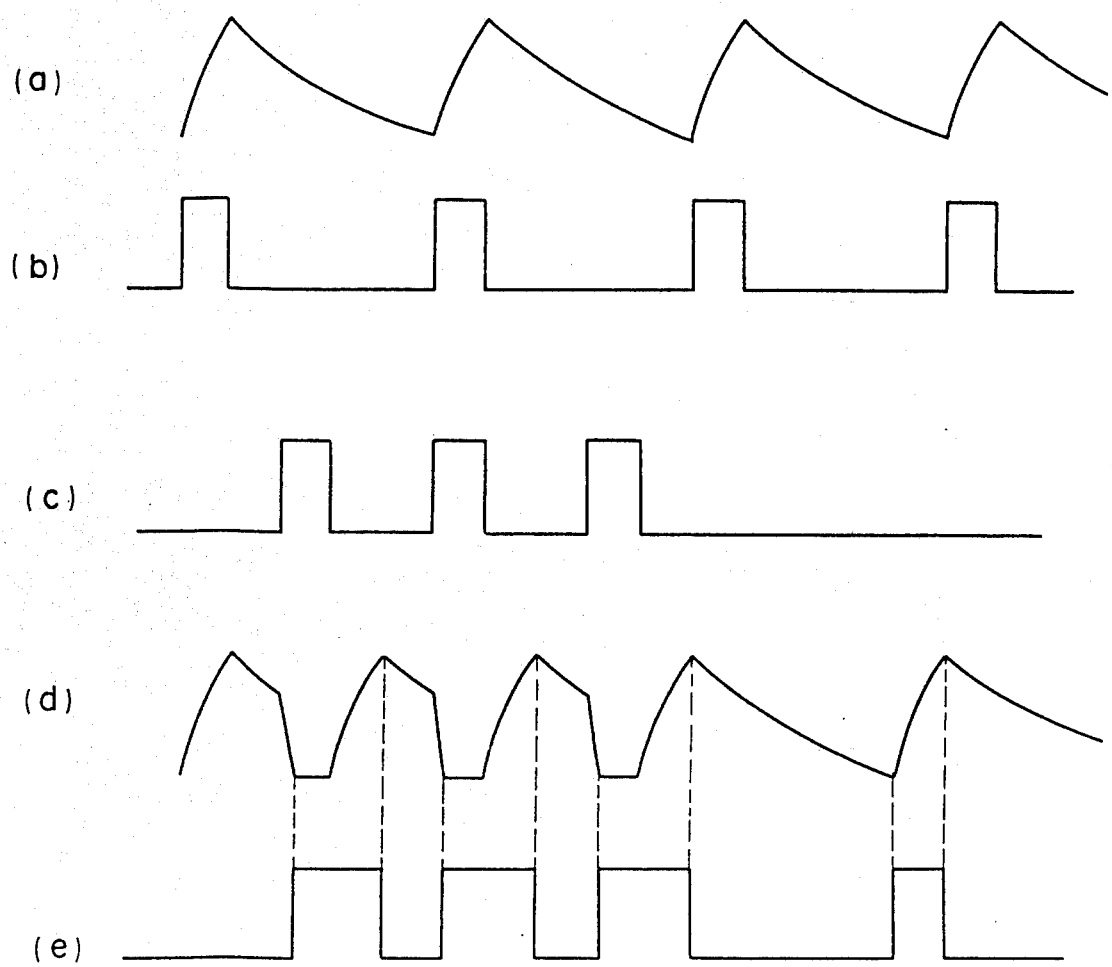
FIG. 8 is a time chart showing waveforms of various parts of the circuit of FIG. 7.

FIG. 7 shows another example of the built-in oscillator 8, wherein an output signal is produced at the waveform shaper 10, by quickly discharging the timer capacitor C, the synchronization of this oscillator 8 is made to the output signal of the waveform shaper 10. FIG. 8 shows waveforms of the parts of the circuit of FIG. 7.

When there is no input light, the voltage at the upper end of the timer capacitor C of FIG. 7 has the voltage waveform of FIG. 8(a), thereby issuing output signal at the waveform shaper 10 as shown by FIG. 8(b).

When there is light input, the output signal as shown by FIG. 8(c) of the waveform shaper 10 makes quick discharging of the timer capacitor C of FIG. 7. Therefore, the upper end of the timer capacitor C shows the voltage waveform of FIG. 8(d), and thereby, the output of the built-in oscillator, i.e., the output of the operational amplifier 16, becomes to have the waveform of FIG. 8(e). In this case the switchable inverter 12 can be identical to the aforementioned.

In the apparatus of the present invention, since the d-flip-flop 300 operates by receiving the data input based on the light signal and the clock signal based on the oscillation of the built-in oscillator 8, the d-flip-flop 300 reads-in the data signal in synchronism with the oscillation of the built-in oscillator 8 which oscillation is drawn in the signal from the input light. Accordingly even in a separate-disposition type usage, the d-flip-flop 300 is given by the clock pulse from the draw-in built-in oscillator 8, and hence undesirable disturbance by the noise light is eliminated.

Furthermore, the apparatus is usable for three types of usages shown by FIG. 2(a), FIG. 2(b) and FIG. 2(c) by selection of the signal to the input terminal S. On top of the above, the apparatus is free of transient erroneous operation at the initial stage of the power source switching on regardless of the above-mentioned three types of usages, by means of providing the quick charge/discharge circuit controlled also by the signal to the input terminal S.

What is claimed is:

1. A photoelectric switching apparatus comprising:
   a light transmitter part comprising a first built in oscillator and a detachable light transmitter circuit which is driven by said first oscillator when said light transmitter is connected to said first oscillator and a detachable light emitter for emitting light in response to signal received from said light transmitter circuit,
   a light receiver part comprising at least a photoelectric transducer for converting a light signal incident thereon to a converted electric signal and a signal processing part for processing the signal based on said converted electric signal,
   an auxiliary part for controlling operation of said light transmitter part and said light receiver part,
   a second oscillator which is separate from said light transmitter part and can be connected to said light transmitter circuit when said light transmitter circuit and said light emitter together are detached from said first oscillator,
   said signal processing circuit comprising a d-flip-flop which reads input data based on said converted electric signal by utilizing an output signal of said first oscillator as its clock pulse, received through a switchable inverter,
   said first oscillator issuing an output signal which is substantially synchronous with said converted electric signal to said d-flip-flop by utilizing a signal based on said converted electric signal when said light transmitter circuit and said light emitter are detached from said first oscillator, and
   said first oscillator issuing an output signal which drives said light transmitter circuit, to said d-flip-flop when said light transmitter is connected to said first oscillator.

2. A photoelectric switching apparatus in accordance with claim 1, wherein said auxiliary part comprises a switchable inverter which selectively switches polarity of the clock pulse impressed on said d-flip-flop thereby to switch timing of said read-in by said d-flip-flop, hence issuing an output, at one of the following two timings that
   (i) each fall-down of the clock pulse when the light receiving transducer receives the light from said light transmitter part, and that
   (ii) each rising up of the clock pulse when the light receiving transducer receives the light from said detached light emitter.

3. A photoelectric switching apparatus in accordance with claim 1 wherein at least said light receiving circuit, said signal processing part, said switchable inverter and said first oscillator are made by ICs.

4. A photoelectric switching apparatus in accordance with claim 2 wherein said auxiliary circuit comprises a control circuit with a control signal terminal, for switching operation mode of said switchable inverter and said first oscillator by impression of a selection signal on said control signal terminal.

5. A photoelectric switching apparatus in accordance with claim 1, which further comprises:
   a voltage detector circuit which detects that the voltage of a DC power source for feeding the electronic circuit of at least said light receiver part enters into a steady state from initial transient state after a switching-on of the DC power source, a gating circuit for controlling issuing of the output of said signal processing part to the final output terminal, responding to an output from said voltage detector circuit, said controlling being in a manner that said issuing is prevented until said issuing becomes at said steady state, an integration circuit having a timer capacitor for integrating the output of said d-flip-flop, and a quick charge/discharge circuit for making said timer capacitor of said integration circuit charge or discharge quickly during the period of said transient state.

6. A photoelectric switching apparatus in accordance with claim 5 wherein said quick charge/discharge circuit is driven by means of a control signal from said auxiliary part, in a manner to take the following switching mode:
   (i) for separate-disposition type usage and for combined-disposition light interception type usage, said quick charge/discharge circuit carries out quick charging by varying a resistor of said integration circuit and
   (ii) for combined-disposition light reflection type usage, said quick charge/discharge circuit carries out quick discharging by varying said resistor of said integration circuit.

* * * * *